United States Patent
Yoo et al.

(10) Patent No.: US 8,698,304 B2
(45) Date of Patent: Apr. 15, 2014

(54) MULTI-CHIP PACKAGE WITH SPACER FOR BLOCKING INTERCHIP HEAT TRANSFER

(75) Inventors: Jae-wook Yoo, Suwon-si (KR); Eun-seok Cho, Seongnam-si (KR); Heo-jung Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1774 days.

(21) Appl. No.: 11/747,270

(22) Filed: May 11, 2007

(65) Prior Publication Data

US 2008/0054433 A1 Mar. 6, 2008

(30) Foreign Application Priority Data

Sep. 5, 2006 (KR) .................. 10-2006-0085302

(51) Int. Cl.
*H01L 23/34* (2006.01)

(52) U.S. Cl.
USPC .......................................... 257/724; 257/725

(58) Field of Classification Search
USPC .......................................... 257/723, 724, 725
See application file for complete search history.

(56) References Cited

U.S. PATENT DOCUMENTS

| | | | | |
|---|---|---|---|---|
| 4,210,464 A | * | 7/1980 | Tanaka et al. | 438/778 |
| 4,590,617 A | * | 5/1986 | Kraemer | 455/328 |
| 5,291,061 A | * | 3/1994 | Ball | 257/686 |
| 5,323,060 A | * | 6/1994 | Fogal et al. | 257/777 |
| 5,610,435 A | * | 3/1997 | Watanabe et al. | 257/629 |
| 5,818,107 A | * | 10/1998 | Pierson et al. | 257/723 |
| 6,005,778 A | | 12/1999 | Spielberger et al. | |
| RE36,613 E | * | 3/2000 | Ball | 257/777 |
| 6,297,960 B1 | * | 10/2001 | Moden et al. | 361/719 |
| 6,333,562 B1 | * | 12/2001 | Lin | 257/777 |
| 6,525,943 B2 | * | 2/2003 | Moden et al. | 361/719 |
| 6,531,784 B1 | * | 3/2003 | Shim et al. | 257/777 |
| 6,552,416 B1 | * | 4/2003 | Foster | 257/666 |
| 6,555,902 B2 | * | 4/2003 | Lo et al. | 257/686 |
| 6,569,709 B2 | * | 5/2003 | Derderian | 438/109 |
| 6,593,662 B1 | * | 7/2003 | Pu et al. | 257/777 |
| 6,603,072 B1 | * | 8/2003 | Foster et al. | 174/536 |
| 6,627,990 B1 | | 9/2003 | Shim et al. | |
| 6,760,224 B2 | * | 7/2004 | Moden et al. | 361/719 |
| 6,773,957 B2 | * | 8/2004 | Farnworth et al. | 438/107 |
| 6,861,288 B2 | * | 3/2005 | Shim et al. | 438/109 |
| 6,867,500 B2 | * | 3/2005 | Corisis et al. | 257/777 |
| 6,906,424 B2 | * | 6/2005 | Kinsman | 257/777 |

(Continued)

FOREIGN PATENT DOCUMENTS

| | | |
|---|---|---|
| JP | 08046134 | 2/1996 |
| JP | 2002-057272 | 2/2002 |

(Continued)

OTHER PUBLICATIONS

Japanese Office Action Dated Nov. 29, 2011.

(Continued)

*Primary Examiner* — Ngan Ngo
(74) *Attorney, Agent, or Firm* — Volentine & Whitt, PLLC

(57) ABSTRACT

A multi-chip package comprises a semiconductor chip stack structure comprising a semiconductor chip stack including a first semiconductor chip having a first power rating and a second semiconductor chip having a second power rating, the first and second semiconductor chips being stacked one on top of another; and a heat transfer blocking spacer interposed between the first semiconductor chip and the second semiconductor chip.

17 Claims, 4 Drawing Sheets

(56) References Cited

U.S. PATENT DOCUMENTS

| | | | |
|---|---|---|---|
| 6,930,378 B1* | 8/2005 | St. Amand et al. | 257/686 |
| 6,930,396 B2* | 8/2005 | Kurita et al. | 257/777 |
| 6,933,172 B2* | 8/2005 | Tomimatsu | 438/109 |
| 6,933,597 B1* | 8/2005 | Poddar et al. | 257/686 |
| 6,946,328 B2* | 9/2005 | Kim et al. | 438/114 |
| 6,946,732 B2* | 9/2005 | Akram et al. | 257/730 |
| 7,041,533 B1* | 5/2006 | Akram et al. | 438/108 |
| 7,084,514 B2* | 8/2006 | Corisis et al. | 257/777 |
| 7,163,839 B2* | 1/2007 | Yan et al. | 438/106 |
| 7,269,897 B2* | 9/2007 | Frezza | 29/832 |
| 7,276,790 B2* | 10/2007 | Seng | 257/724 |
| 7,323,786 B2* | 1/2008 | Sasaki | 257/777 |
| 7,422,930 B2* | 9/2008 | Thomas et al. | 438/109 |
| 7,443,037 B2* | 10/2008 | Kim et al. | 257/777 |
| 7,485,490 B2* | 2/2009 | Oh et al. | 438/106 |
| 7,492,039 B2* | 2/2009 | Seng | 257/686 |
| 7,494,847 B2* | 2/2009 | Karnezos et al. | 438/109 |
| 7,588,963 B2* | 9/2009 | Chao et al. | 438/109 |
| 2002/0024798 A1* | 2/2002 | Moden et al. | 361/719 |
| 2002/0043711 A1* | 4/2002 | Akram et al. | 257/690 |
| 2002/0068417 A1* | 6/2002 | Farnworth et al. | 438/455 |
| 2003/0022462 A1* | 1/2003 | Farnworth et al. | 438/455 |
| 2003/0038353 A1* | 2/2003 | Derderian | 257/685 |
| 2003/0038354 A1* | 2/2003 | Derderian | 257/685 |
| 2003/0038357 A1* | 2/2003 | Derderian | 257/686 |
| 2003/0071362 A1* | 4/2003 | Derderian | 257/777 |
| 2003/0128523 A1* | 7/2003 | Moden et al. | 361/719 |
| 2003/0176018 A1* | 9/2003 | Derderian | 438/109 |
| 2003/0189259 A1* | 10/2003 | Kurita et al. | 257/777 |
| 2004/0159942 A1* | 8/2004 | Kinsman | 257/734 |
| 2005/0067684 A1* | 3/2005 | Derderian | 257/777 |
| 2005/0133916 A1* | 6/2005 | Karnezos | 257/738 |
| 2005/0146009 A1* | 7/2005 | Corisis et al. | 257/686 |
| 2005/0184378 A1* | 8/2005 | Sasaki | 257/686 |
| 2005/0282313 A1* | 12/2005 | Akram et al. | 438/108 |
| 2006/0022323 A1* | 2/2006 | Swee Seng | 257/686 |
| 2006/0038275 A1* | 2/2006 | Yoshimura | 257/686 |
| 2006/0043559 A1* | 3/2006 | Chow et al. | 257/686 |
| 2006/0113643 A1* | 6/2006 | Loo et al. | 257/666 |
| 2006/0197211 A1* | 9/2006 | Miyata et al. | 257/686 |
| 2006/0261492 A1* | 11/2006 | Corisis et al. | 257/777 |
| 2007/0085184 A1* | 4/2007 | Kwon et al. | 257/686 |
| 2007/0096335 A1* | 5/2007 | Kwon et al. | 257/777 |
| 2007/0114677 A1* | 5/2007 | Kwon et al. | 257/796 |
| 2007/0152308 A1* | 7/2007 | Ha et al. | 257/666 |
| 2007/0158833 A1* | 7/2007 | Park et al. | 257/734 |
| 2007/0205495 A1* | 9/2007 | Fernandez et al. | 257/686 |
| 2007/0218586 A1* | 9/2007 | Yoshimura et al. | 438/106 |
| 2007/0222051 A1* | 9/2007 | Yoshimura et al. | 257/678 |
| 2007/0287228 A1* | 12/2007 | Chai et al. | 438/109 |
| 2008/0001283 A1* | 1/2008 | Lee et al. | 257/712 |
| 2008/0012095 A1* | 1/2008 | Lee et al. | 257/618 |
| 2008/0087989 A1* | 4/2008 | Sasaki | 257/659 |
| 2008/0153200 A1* | 6/2008 | Sitaram | 438/106 |
| 2008/0171402 A1* | 7/2008 | Karnezos | 438/15 |
| 2008/0197470 A1* | 8/2008 | Yoshimura et al. | 257/686 |
| 2008/0220563 A1* | 9/2008 | Karnezos | 438/107 |
| 2009/0014899 A1* | 1/2009 | Park et al. | 257/779 |
| 2009/0078456 A1* | 3/2009 | Macropoulos et al. | 174/261 |
| 2009/0121338 A1* | 5/2009 | Seng | 257/686 |
| 2009/0174051 A1* | 7/2009 | Osaka et al. | 257/686 |
| 2009/0243065 A1* | 10/2009 | Sugino et al. | 257/686 |
| 2010/0088887 A1* | 4/2010 | Murai et al. | 29/846 |
| 2010/0091804 A1* | 4/2010 | Musio et al. | 372/20 |

FOREIGN PATENT DOCUMENTS

| | | |
|---|---|---|
| JP | 2003017638 | 1/2003 |
| JP | 2003303937 | 10/2003 |
| JP | 2004006564 | 1/2004 |
| JP | 2004228485 | 8/2004 |
| JP | 2006066816 | 3/2006 |
| KR | 1020060004302 A | 1/2006 |

OTHER PUBLICATIONS

Japanese Office Action Dated Nov. 13, 2012.

* cited by examiner

MULTI-CHIP PACKAGE WITH SPACER FOR BLOCKING INTERCHIP HEAT TRANSFER

BACKGROUND OF THE INVENTION

1. Field of the Invention

The present disclosure relates generally to a semiconductor chip package and, more particularly, to a multi-chip package formed by mounting a plurality of semiconductor chips in one package including a heat transfer blocking mechanism.

A claim of priority is made to Korean Patent Application No. 10-2006-0085302, filed on Sep. 5, 2006, in the Korean Intellectual Property Office, the disclosure of which is incorporated herein in its entirety by reference.

2. Description of the Related Art

Traditionally, semiconductor chips were mounted such that only one chip was mounted in a semiconductor package. However, with advances in the electronics industry which have seen the development of increasingly thin, flat, and light-weight electronic products, multi chip package ("MCP") technology has been developed. Specifically, by using MCP technology, multiple chips may be mounted in a single semiconductor package. By mounting multiple chips in one package, MCP technology allows a manufacturer to reduce the size, weight, and mount area of a semiconductor package. Indeed, as sizes of many electronic devices are being continuously reduced, there has been an increase in the use of MCP to build semiconductor devices such as flash memory, volatile memory, microchips, etc.

In MCP technology, different types of chips may be mounted in the same package. Therefore, chips mounted in the same package may have different attributes. For example, one chip in the package may be rated to consume more power than the other(s). Furthermore, even if two semiconductor chips perform the same function, they may be rated to consume different amounts of power. For example, the power consumed by a volatile memory chip may be different than that consumed by a non-volatile memory chip.

As such, when different kinds of memory chips having different power consumption ratings are mounted in the same semiconductor package, there may be a few problems. For example, the junction temperature $T_j$ of a semiconductor chip having a relatively low power rating may increase when such a chip is placed adjacent to another semiconductor chip having a relatively higher power rating. This is because heat generated from the chip having the higher power rating may be transferred to the chip having the lower power rating. Now, if the $T_j$ of a chip exceeds the chip's maximum junction allowance temperature $T_{jmax}$, the chip's attributes such as, for example, refresh characteristics, operating speed, and operating life, may be compromised.

There is therefore a need for semiconductor packages which include mechanisms to prevent the transfer of heat from one chip to another housed in the same package. The present disclosure is directed towards one or more such semiconductor packages.

SUMMARY OF THE INVENTION

An aspect of the present disclosure includes a multi-chip package. The multi-chip package comprises a semiconductor chip stack including a first semiconductor chip having a first power rating and a second semiconductor chip having a second power rating, the first and second semiconductor chips being stacked one on top of another; and a heat transfer blocking spacer interposed between the first semiconductor chip and the second semiconductor chip.

BRIEF DESCRIPTION OF THE DRAWINGS

The above and other features of the present disclosure will become more apparent by describing in detail exemplary embodiments thereof with reference to the attached drawings in which.

FIG, 6 is a sectional view illustrating a portion of a multi-chip package according to an alternative exemplary disclosed embodiment.

DETAILED DESCRIPTION OF EXEMPLARY EMBODIMENTS

Figure 1:
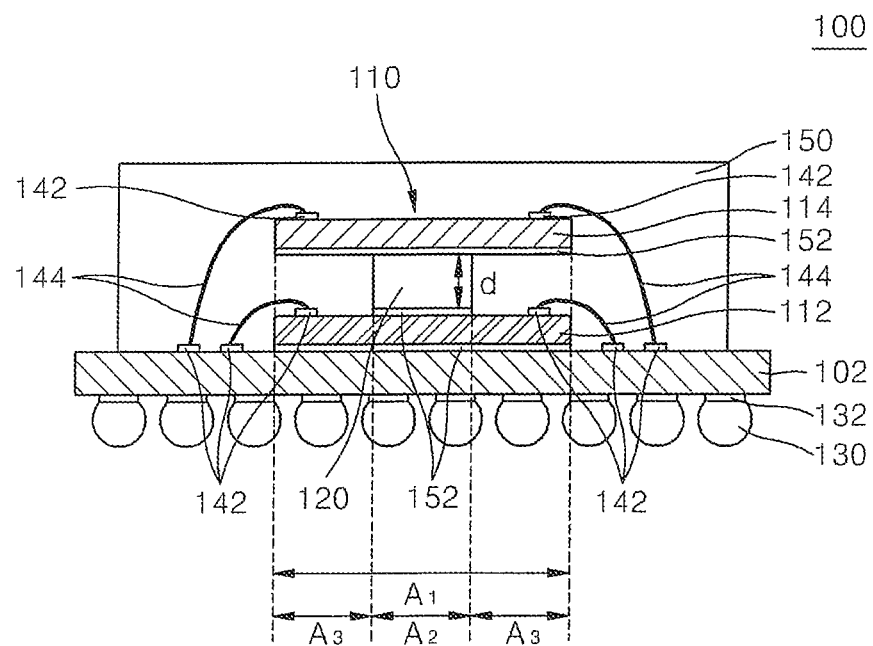
FIG. 1 is a sectional view illustrating a structure of a multi-chip package according to an exemplary disclosed embodiment.

The present disclosure will now be described more fully hereinafter with reference to the accompanying drawings, in which preferred embodiments of the disclosure are shown. This disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the thicknesses of layers and regions are exaggerated for clarity.

FIG. 1 is a sectional view illustrating a schematic structure of a multi-chip package 100 according to an exemplary disclosed embodiment. Referring to FIG. 1, the multi-chip package 100 comprises a semiconductor chip stack structure 110 mounted on the top surface of a printed circuit board 102. In particular, the semiconductor chip stack structure 110 comprises a first semiconductor chip 112 that may have a first power rating and a second semiconductor chip 114 having a second power rating. That is, chip 112 and chip 114 may be rated to consume different amounts of power. In addition, the first semiconductor chip 112 and the second semiconductor chip 114 of the semiconductor chip stack structure 110 are sequentially and vertically stacked on a region $A_1$ of the printed circuit board 102 such that they lie one on top of another.

The semiconductor chip stack structure 10 also includes a heat transfer blocking spacer 120. Specifically, the heat transfer blocking spacer 120 is interposed between the first semiconductor chip 112 and the second semiconductor chip 114. In an exemplary embodiment, the heat transfer blocking spacer 120 is interposed between the first semiconductor chip 112 and the second semiconductor chip 114 in order to suppress the transfer of heat that may be generated between the first semiconductor chip 112 and the second semiconductor chip 114. To this end, the heat transfer blocking spacer 120 may be composed of a material having a low heat transfer property as compared to those of the materials of component elements disposed above and below the heat transfer blocking spacer 120. In an exemplary embodiment, the heat transfer blocking spacer 120 may be composed of an insulation material such as, for example, epoxy resin, magnesium carbonate, calcium silicate, magnesia, perlite, cork, cotton felt, cork carbide, asbestos, glass wool, quartz wool, kieselguhr, or a mixture thereof.

In an exemplary embodiment, a thickness d of the heat transfer blocking spacer 120 is not limited to a specific one, but instead may be selected from a range of, for example, about 50 to 400 μm. Furthermore, the heat transfer blocking spacer 120 may be formed of a sheet-type member having an upper surface whose shape is, for example, circular, elliptical, or polygonal. Alternatively, the heat transfer blocking spacer 120 may have an upper surface shaped as a ring, a cross, a curve or a bent or straight line.

A region $A_2$ exists on the upper surface of the first semiconductor chip 112. This second region $A_2$ is generally a portion of the first region $A_1$ and is opposite to the second semiconductor chip 114. Furthermore, the region $A_2$ is covered with the heat transfer blocking spacer 120.

FIG. 1 illustrates that only a part of the first region $A_1$ on the upper surface of the first semiconductor chip 112 is covered with the heat transfer blocking spacer 120. However, the scope of the disclosure is not limited to the structure shown in FIG. 1. That is, when a width of the heat transfer blocking spacer 120 is equal to or greater than a width of the first semiconductor chip 112 or a width of the second semiconductor chip 114, the first region $A_1$ may be completely covered with the heat transfer blocking spacer 120.

Furthermore, the region $A_2$ that is covered by the heat transfer blocking spacer may be equal to or greater than a region $A_3$ that is not covered by the heat transfer blocking spacer. Alternatively, the region $A_2$ that is covered by the heat transfer blocking spacer may be equal to or less than the region $A_3$ that is not covered by the heat transfer blocking spacer.

As illustrated in FIG. 1, the multi-chip package 100 has a ball grid array (BGA) package structure, in which a solder ball 130 provides an external connection terminal attached to a lower surface of the printed circuit board 102. Furthermore, this solder ball 130 is electrically connected to the printed circuit board 102 through an electrode pad 132. The solder ball 130 may have many features. For example, the heat generated from the semiconductor chip stack structure 110 may be emitted through the solder ball 130. In addition, the first semiconductor chip 112 and the second semiconductor chip 114 are electrically connected to the printed circuit board 102 through an electrode pad 142 and a wire 144. Moreover, the first semiconductor chip 112, the heat transfer blocking spacer 120, and the second semiconductor chip 114 are vertically stacked on the upper surface of the printed circuit board 102, using adhesive layers 152 interposed between these components. In addition, the semiconductor chip stack structure 110 on the printed circuit board 102 is protected by a molding resin 150.

In an exemplary embodiment, the first semiconductor chip 112 and the second semiconductor chip 114 may have different functions. For example, the first semiconductor chip 112 may be a logic chip, and the second semiconductor chip 114 may be a memory chip. In this case, because the heat generated from the semiconductor chip stack structure 110 in the multi-chip package 100 exemplary illustrated in FIG. 1 is externally emitted through the solder ball 130, it may be beneficial to mount a logic chip requiring a higher consumed power than a memory chip closer to the solder ball 130.

In an alternative exemplary embodiment, the first semiconductor chip 112 and the second semiconductor chip 114 may be different kinds of memory chips. For example, one of the first semiconductor chip 112 and the second semiconductor chip 114 may be a volatile memory chip, and the other one may be a non-volatile memory chip. For example, the first semiconductor chip 112 and the second semiconductor chip 114 may be respectively formed of memory chips selected from the group consisting of DRAM, SRAM, NAND flash, and NOR flash. In this case, it may be beneficial to mount one of the first semiconductor chip 112 and the second semiconductor chip 114 which requires a higher consumed power, closer to the solder ball 130.

Figure 2:
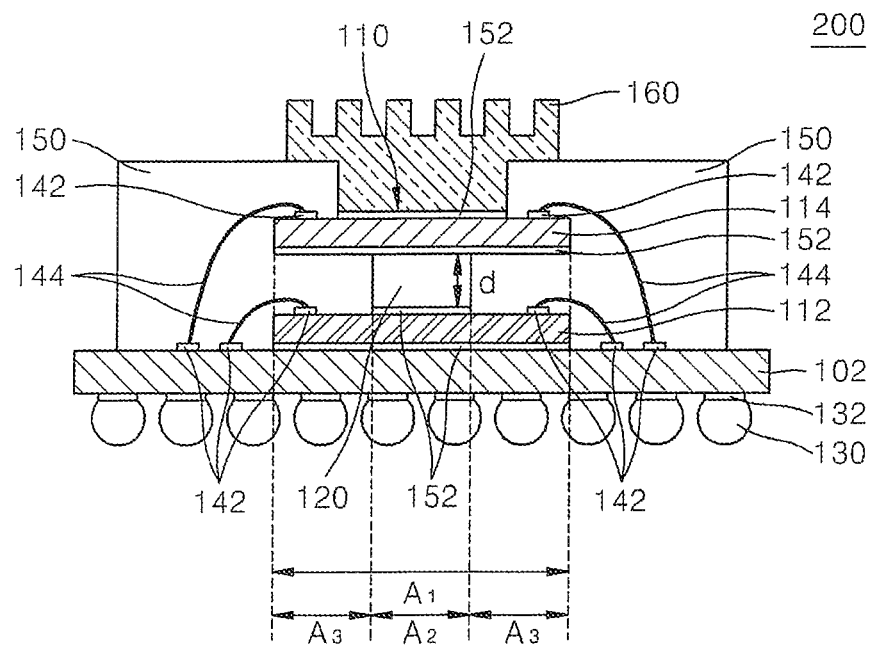
FIG. 2 is a sectional view illustrating a structure of a multi-chip package according to an alternative exemplary disclosed embodiment.

FIG. 2 is a sectional view illustrating a schematic structure of a multi-chip package 200 according to an alternative exemplary disclosed embodiment. The structure of the multi-chip package 200 exemplarily illustrated in FIG. 2 is similar to the structure of the multi-chip package 100 exemplarily illustrated in FIG. 1 except that a heat sink 160 is formed on the upper surface of the multi-chip package 200. In FIG. 2, like numerals of FIG. 1 refer to like elements of FIG. 1, and a detailed explanation thereof will be omitted.

In an exemplary embodiment, a heating efficiency of the heat sink 160 may be higher than that of the solder ball 130. It may therefore be beneficial to mount one of the first semiconductor chip 112 and the second semiconductor chip 114 which requires a higher consumed power, closer to the heat sink 160. That is, when a logic chip and a memory chip are mounted together on a printed circuit board 102 in the structure exemplarily illustrated in FIG. 2, the logic chip would be the second semiconductor chip 114 that is disposed closer to the heat sink 160 than the first semiconductor chip 112. Alternatively, when two different kinds of memory chips are mounted on the printed circuit board 102, the second semiconductor chip 114 that is disposed closer to the heat sink 160 is beneficially the memory chip requiring a relatively high consumed power of the two different memory chips, and the first semiconductor chip 112 is formed of a memory chip requiring a relatively low consumed power.

Figure 3:
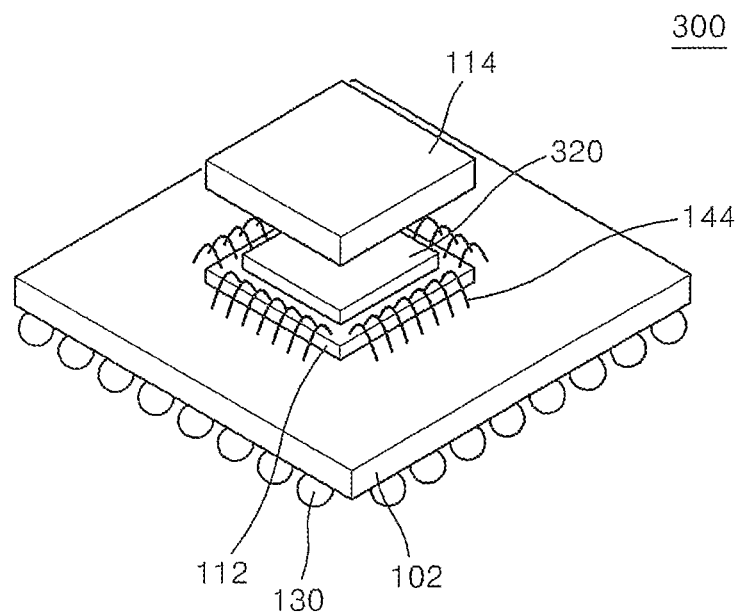
FIG. 3 is a partially exploded perspective view illustrating a portion of a multi-chip package according to an exemplary disclosed embodiment.

FIG. 3 is a partially exploded perspective view schematically illustrating a portion of a multi-chip package 300 according to an exemplary disclosed embodiment. In FIG. 3, like numerals of FIG. 1 refer to like elements of FIG. 1. Therefore, a detailed explanation thereof will be omitted.

The structure of the multi-chip package 300 illustrated in FIG. 3 is similar to the structure of the multi-chip package 100 of FIG. 1, except that a heat transfer blocking spacer 320 composed of a sheet-type member having a rectangular upper surface of a relatively large size is employed. In a first region $A_1$ on the upper surface of the first semiconductor chip 112 of FIG. 3, the area occupied by a second region $A_2$, which is covered by the heat transfer blocking spacer 320, is greater than that of a third region $A_3$ which is not covered by the heat transfer blocking spacer 320.

Figure 4:
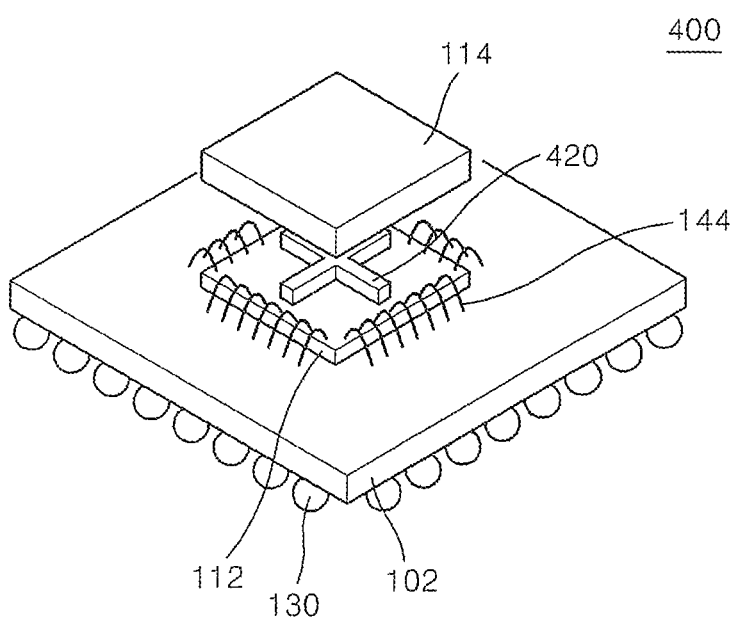
FIG. 4 is a partially exploded perspective view schematically illustrating a portion of a multi-chip package according to an alternative exemplary disclosed embodiment.

FIG. 4 is a partially exploded perspective view schematically illustrating a portion of a multi-chip package 400 according to an alternative exemplary disclosed embodiment. In FIG. 4, like numerals of FIG. 1 refer to like elements of FIG. 1. Therefore, a detailed explanation thereof will be omitted.

The structure of the multi-chip package 400 illustrated in FIG. 4 is similar to the structure of the multi-chip package 100 of FIG. 1, except that a cross-shaped heat transfer blocking spacer 420 is employed. In a first region $A_1$ on the upper surface of the first semiconductor chip 112 of FIG. 4, the area occupied by a second region $A_2$, which is covered by the heat transfer blocking spacer 420, is greater than that of a third region $A_3$ which is not covered by the heat transfer blocking spacer 420.

Figure 5:
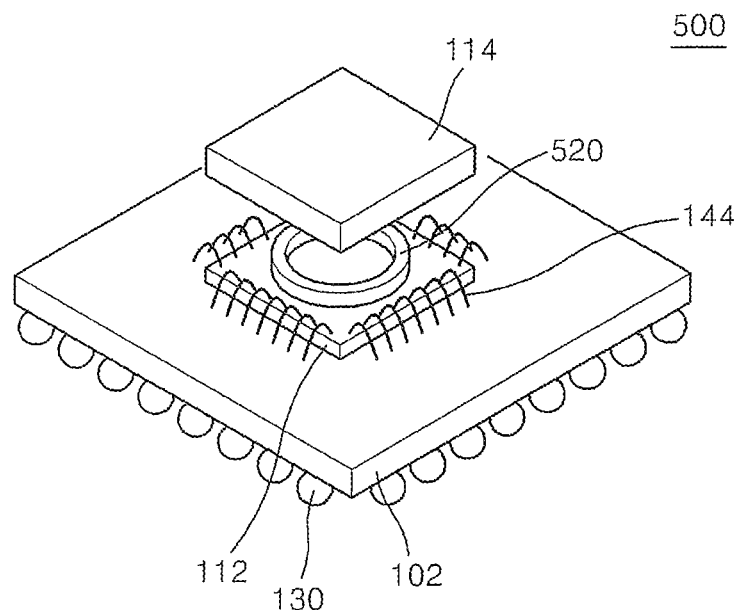
FIG. 5 is a partially exploded perspective view schematically illustrating a portion of a multi-chip package according to an alternative exemplary disclosed embodiment.

FIG. 5 is a partially exploded perspective view schematically illustrating a portion of a multi-chip package 500 according to an alternative exemplary disclosed embodiment. In FIG. 5, like numerals of FIG. 1 refer to like elements of FIG. 1 and, therefore, a detailed explanation thereof will be omitted. The multi-chip package 500 exemplarily illustrated in FIG. 5 is similar to the structure of the multi-chip package 100 of FIG. 1 except that a ring-shaped heat transfer blocking spacer 520 is employed.

Figure 6:
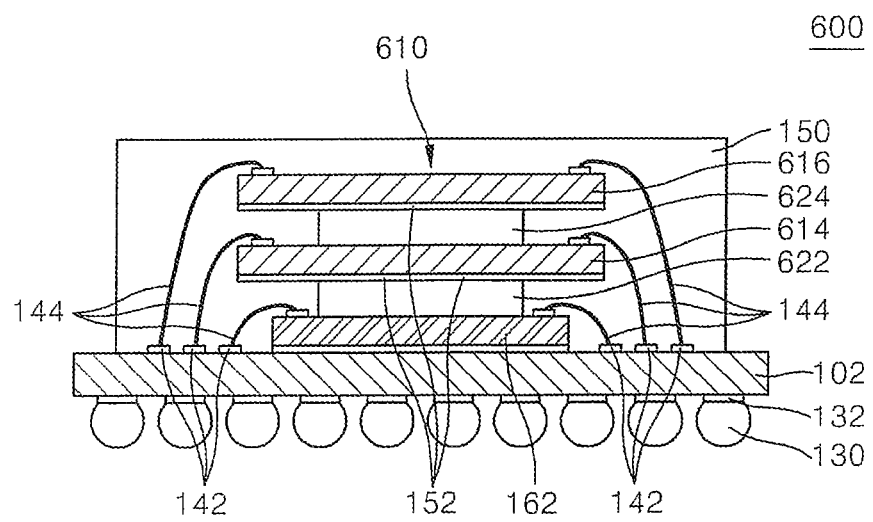

FIG. 6 is a sectional view illustrating a portion of a multi-chip package 600 according to an alternative exemplary disclosed embodiment. In FIG. 6, like numerals of FIG. 1 refer to like elements of FIG. 1 and, therefore, a detailed explanation thereof will be omitted.

The multi-chip package 600 exemplarily illustrated in FIG. 6 is similar to the structure of the multi-chip package 100 of FIG. 1, except that a semiconductor chip stack structure 610 is composed of, for example, one logic chip and a plurality of memory chips. FIG. 6 exemplarily illustrates the semiconductor chip stack structure 610 including one semiconductor chip 612 that is, for example, a logic chip, and two semiconductor chips 614 and 616 that are, for example, memory chips. Furthermore, a first heat transfer blocking spacer 622 is interposed between the semiconductor chip 612 and the semiconductor chip 614, and a second heat transfer blocking spacer 624 is interposed between the semiconductor chip 614 and the semiconductor chip 616. Moreover, adhesive layers 152 are respectively interposed between the semiconductor chips 612, 614, and 616; the first heat transfer blocking spacer 622; the second heat transfer blocking spacer 624; and a printed circuit board 102, in order to adhere two neighboring components thereof.

In an exemplary embodiment, the first heat transfer blocking spacer 622 and the second heat transfer blocking spacer 624 in FIG. 6 are respectively composed of sheet-type members similar to the heat transfer blocking spacer 120 of FIG. 1. However, one skilled in the art will appreciate that the scope of the disclosure is not limited thereto. For example, the first heat transfer blocking spacer 622 and the second heat transfer blocking spacer 624 may be respectively composed of sheet-type members, each having a width greater than that of each of a plurality of the semiconductor chips 612, 614, and 616. Alternatively, the first heat transfer blocking spacer 622 and the second heat transfer blocking spacer 624 may be respectively composed of cross-shaped members or ring-shaped members as illustrated in FIGS. 4 and 5, or may be respectively composed of members having an upper surface that is polygonal in shape, or curved.

In an exemplary embodiment as illustrated in FIG. 6, in which three or more semiconductor chips 612, 614, and 616 are mounted on one printed circuit board 102, it may be beneficial to mount the chip which requires a higher consumed power, closest to a solder ball 130. Similarly, even though not shown in FIG. 6, in the BGA type package having the solder ball 130 as shown in FIG. 2 and further having the heat sink 160 on its upper surface, a chip requiring the highest consumed power among a plurality of the semiconductor chips 612, 614, and 616 may be beneficially mounted closest to the heat sink 160.

FIG. 6 illustrates an example in which a plurality of the semiconductor chips 612, 614, and 616 are sequentially stacked on only one surface of the printed circuit board 102. However, the scope of the present disclosure is not limited thereto. For example, a plurality of semiconductor chips may be mounted on both, an upper surface and a lower surface of the printed circuit board 102 without departing from the scope of the disclosure.

Figure 7:
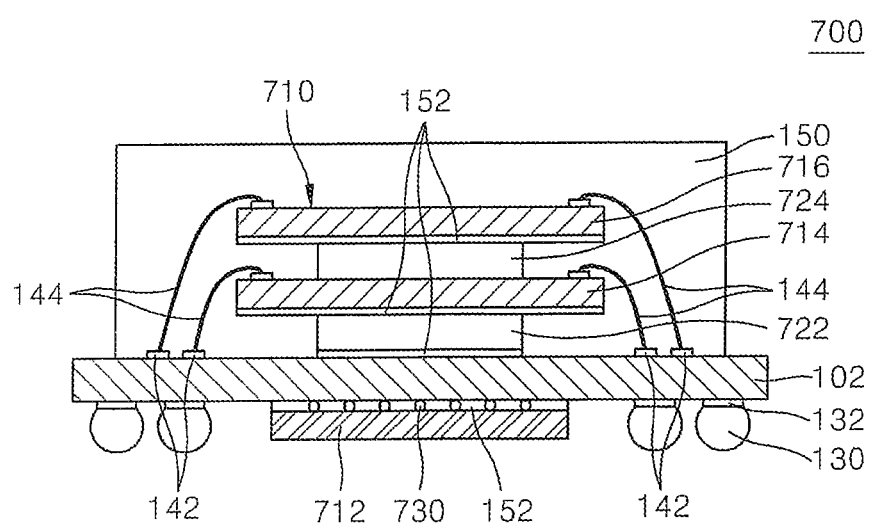
FIG. 7 is a sectional view illustrating a portion of a multi-chip package according to an alternative exemplary disclosed embodiment.

FIG. 7 is a sectional view illustrating a portion of a multi-chip package 700 according to an alternative exemplary disclosed embodiment. In FIG. 7, like numerals of FIG. 1 refer to like elements of FIG. 1 and, therefore, a detailed explanation thereof will be omitted.

The multi-chip package 700 of FIG. 7 comprises a semiconductor chip stack structure 710 composed of one logic chip and a plurality of memory chips like the multi-chip package 600 of FIG. 6. However, the structure of FIG. 7 is different from the structure of FIG. 6 in that semiconductor chips are mounted on both surfaces of the printed circuit board 102.

In FIG. 7, a semiconductor chip 712 that may be, for example, one logic chip and a plurality of semiconductor chips 714 and 716 that may be, for example, memory chips, are mounted opposite to one another on either side of the printed circuit board 102. Furthermore, the semiconductor chip 712 is electrically connected to the printed circuit board 102 through a plurality of bumps 730. In addition, an adhesive layer 152 is interposed between the printed circuit board 102 and the semiconductor chip 712 to adhere these two components.

Moreover, as shown exemplarily in FIG. 7, a first heat transfer blocking spacer 722 is interposed between the printed circuit board 102 and the semiconductor chip 714, and a second heat transfer blocking spacer 724 is interposed between the semiconductor chip 714 and the semiconductor chip 716. In addition, adhesive layers 152 are interposed between the semiconductor chips 712, 714, and 716, the first heat transfer blocking spacer 722, the second heat transfer blocking spacer 724, and the printed circuit board 102 to adhere two neighboring components. Furthermore, in an exemplary embodiment, one of the semiconductor chips 714 and 716 mounted on the printed circuit board 102, which requires a higher consumed power, may be positioned closer to the solder ball 130 than the others.

FIG. 7 illustrates the structure in which the first heat transfer blocking spacer 722 and the second heat transfer blocking spacer 724 are composed of sheet-type members similar to that shown in FIG. 1. However, the scope of the disclosure is not limited thereto. That is, the first heat transfer blocking spacer 722 and the second heat transfer blocking spacer 724 may be composed of sheet-type members, each having a width greater than that of each of the semiconductor chips 712, 714, and 716. Furthermore, the first heat transfer blocking spacer 722 and the second heat transfer blocking spacer 724 may be composed of cross-shaped or ring-shaped members similar to those as shown in FIGS. 4 and 5, or may be composed of members having an upper surface that is polygonal in shape or curved.

The heat transfer blocking spacers formed in the multi-chip package according to disclosed embodiments may function to limit thermal interference between chips in a structure including a plurality of semiconductor chips that are stacked on one printed circuit board. That is, the disclosed structures may prevent the transfer of heat from a chip that consumes relatively higher power to a chip that consumes lower power. Thus, the operating characteristics of the chip may not be compromised. In particular, as shown in FIGS. 4 and 5, when the heat transfer blocking spacer has a relatively small upper surface that is interposed between the two neighboring semiconductor chips, the contact area between the two neighboring semiconductor chips can be minimized by the presence of the heat transfer blocking spacer, thereby effectively suppressing the heat transfer between the two chips.

Furthermore, the disclosed heat transfer blocking spacers may provide effective wire connection structures that are capable of electrically connecting the respective semiconductor chips of the semiconductor chip stack structures to the printed circuit board through wires. Specifically, when a heat transfer blocking spacer is interposed between two neighboring semiconductor chips where the blocking spacer has a smaller width than that of each chip, bumps for wire bonding may be formed at the space between the two semiconductor chips. Alternatively, when a heat transfer blocking spacer is interposed between two neighboring semiconductor chips, in which the blocking spacer has a width greater than that of each chip, bumps may be formed on the heat transfer blocking spacer. In an exemplary embodiment, in order to electrically connect, of the two semiconductor chips, the semiconductor chip that is located at the upper position to the printed circuit board that is located below the semiconductor chips through a wire, the wire may be used to connect these components by using a bump formed on the heat transfer blocking spacer

EVALUATION EXAMPLE 1

In order to evaluate the characteristics of a thermal barrier limiting thermal interference between chips by the presence of the heat transfer blocking member in the multi-chip package according to exemplary disclosed embodiments, a sample of the semiconductor chip stack structure as shown in FIG. 6 is prepared.

The semiconductor chip stack structure is structured such that one logic chip, one DRAM chip, and one flash memory chip are sequentially stacked on a printed circuit board. Furthermore, the first heat transfer blocking spacer 622 and the second heat transfer blocking spacer 624 of FIG. 6 are respectively interposed between the logic chip and the DRAM chip, and between the DRAM chip and the flash memory chip. In this example, the heat transfer blocking spacer employs a rectangular-shaped magnesium carbonate spacer with a thickness of about 200 µm. Furthermore, in this example, consumed power of the logic chip is 0.85 W and consumed power of the DRAM chip is 0.25 W.

Simulation is performed using JEDEC standard (JESD51-3) in order to evaluate the characteristics of heat transfer between semiconductor chips in the multi-chip package according to the exemplary disclosed embodiments. The simulation is performed as follows:

A semiconductor chip stack structure mounted on a printed circuit board (14 mm×14 mm, max 1.6 t) having a plurality of solder balls, in which the semiconductor chip stack structure comprises a logic chip, a DRAM chip, and a flash memory chip, which are stacked on the printed circuit board, and magnesium carbonate spacers respectively interposed between two component chips is evaluated at a room temperature and a natural convection condition.

EVALUATION EXAMPLE 2

As a comparative example, all the conditions are the same as those of the Evaluation Example 1 except for the use of a silicon spacer instead of the magnesium carbonate spacer.

As evaluation results of Evaluation Examples 1 and 2, the heat generated from the logic chip in the Evaluation Example 2 is directly transferred to the DRAM chip located above the logic chip through the silicon spacer. At this time, junction temperatures $T_j$ of the logic chip and the DRAM chip are both measured to 96.1° C.

On the other hand, junction temperatures $T_j$ of the logic chip and the DRAM chip in the Evaluation 1 are measured to 97.2° C. and 93.1° C., respectively. It is understood that the magnesium carbonate spacer interposed between the logic chip and the DRAM chip functions as a thermal barrier, and the heat generated from the logic chip is not transferred to the DRAM chip located upside but instead is trapped in the logic chip. As a result, $T_j$ of the logic chip increases to a higher value in Example 1 than that in Evaluation Example 2, and $T_j$ of the DRAM chip decreases by 3° C. as compared to that in Evaluation Example 2. Given the fact that a maximum Tj, Tjmax of the logic chip is 125° C., and a maximum Tj, Tjmax of the DRAM chip is 105° C., it is understood that $T_j$ of the DRAM chip in Evaluation Example 1 is more stable than that of Evaluation Example 2 because the magnesium carbonate spacer of Evaluation Example 1 functions as a thermal barrier.

EVALUATION EXAMPLE 3

All the conditions are the same as those of the Evaluation Example 1 except for the use of a cross-shaped spacer shown in FIG. 4 instead of the rectangular-shaped spacer.

As a result of a test conducted with the cross-shaped structure, junction temperatures $T_j$ of the logic chip and the DRAM chip in the Evaluation 3 are measured to be 96.6° C. and 95.3° C. respectively. Given the fact that a maximum Tj, Tjmax of the logic chip is 125° C., and a maximum Tj, Tjmax of the DRAM chip is 105° C., it is understood that Tj of the DRAM chip in Evaluation Example 3 is more stable than that of Evaluation Example 2 because the magnesium carbonate spacer of Evaluation Example 3 functions as a thermal barrier.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A multi-chip package comprising:
    a semiconductor chip stack including a first semiconductor chip having a first power rating and a second semiconductor chip having a second power rating, the first and second semiconductor chips being stacked one on top of another; and
    a heat transfer blocking spacer interposed between the first semiconductor chip and the second semiconductor chip, the material of the heat transfer blocking spacer comprising at least one of magnesium carbonate, calcium silicate, magnesia, perlite, cork, cotton felt, cork carbide, asbestos, glass wool, quartz wool, and kieselguhr and having a lower thermal conductivity than the materials of the first semiconductor chip and the second semiconductor chip, whereby the heat transfer blocking spacer reduces thermal interference between the chips,
    wherein a thickness of the heat transfer blocking spacer is between 50 µm and 400 µm, both inclusive.

2. The multi-chip package of claim 1, wherein a surface of one of the first and second chips is partially covered by the heat transfer blocking spacer.

3. The multi-chip package of claim 1, wherein a surface of one of the first and second chips is completely covered by the heat transfer blocking spacer.

4. The multi-chip package of claim 2, wherein the portion of the surface of one of the first and second chips covered by the heat transfer blocking spacer is equal to or greater than the portion not covered by the heat transfer blocking spacer.

5. The multi-chip package of claim 2, wherein the portion of the surface of one of the first and second chips covered by the heat transfer blocking spacer is equal to or less than the portion not covered by the heat transfer blocking spacer.

6. The multi-chip package of claim 1, wherein the heat transfer blocking spacer has an upper surface that is one of a ring shape, cross shape, curved, or rectangular.

7. The multi-chip package of claim 1, wherein the first and second chips perform different functions.

8. The multi-chip package of claim 7, wherein the first semiconductor chip is a logic chip and the second semiconductor chip is a memory chip.

9. The multi-chip package of claim 1, wherein the first semiconductor chip and the second semiconductor chip are different kinds of memory chips.

10. The multi-chip package of claim 9, wherein one of the first semiconductor chip and the second semiconductor chip is a volatile memory chip, and the other is a non-volatile memory chip.

11. The multi-chip package of claim 1, further comprising a solder ball disposed on the printed circuit board so as to form a ball grid array (BGA), such that the semiconductor chip with the higher power rating is disposed closer to the solder ball.

12. The multi-chip package of claim 1, further comprising a heat sink disposed on an upper portion of the semiconductor chip stack such that the semiconductor chip with the higher power rating is disposed closer to the heat sink.

13. The multi-chip package of claim 1, further comprising a solder ball disposed on the printed circuit board so as to form a ball grid array (BGA), such that the semiconductor chip with the higher power rating is disposed closer to the solder ball; and a heat sink disposed on an upper portion of the semiconductor chip stack structure such that the semiconductor chip with the higher power rating is disposed closer to the heat sink.

14. The multi-chip package of claim 1, wherein the semiconductor chip stack comprises one semiconductor logic chip, and a plurality of semiconductor memory chips.

15. The multi-chip package of claim 1, wherein the first semiconductor chip and the second semiconductor chip are sequentially stacked on a same side of a printed circuit board.

16. The multi-chip package of claim 1, wherein the first semiconductor chip and the second semiconductor chip are mounted on either side of a printed circuit board such that the printed circuit board is interposed between the chips.

17. The multi-chip package of claim 1, further including adhesive layers interposed between the first semiconductor chip and the heat transfer blocking spacer, and between the second semiconductor chip and the heat transfer blocking spacer.

* * * * *